(12) United States Patent
Yun et al.

(10) Patent No.: US 12,394,678 B2
(45) Date of Patent: Aug. 19, 2025

(54) TEST APPARATUS AND METHOD FOR A SEMICONDUCTOR DEVICE

(71) Applicant: SAMSUNG ELECTRONICS CO., LTD., Suwon-si (KR)

(72) Inventors: Junghoo Yun, Hwaseong-si (KR); Jaemoon Lim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 637 days.

(21) Appl. No.: 17/837,213

(22) Filed: Jun. 10, 2022

(65) Prior Publication Data
US 2023/0136802 A1    May 4, 2023

(30) Foreign Application Priority Data

Nov. 3, 2021 (KR) .................. 10-2021-0149424

(51) Int. Cl.
*H01L 21/66* (2006.01)
*G01N 3/24* (2006.01)

(52) U.S. Cl.
CPC .............. *H01L 22/32* (2013.01); *G01N 3/24* (2013.01); *G01N 2203/0017* (2013.01); *G01N 2203/0025* (2013.01); *G01N 2203/0075* (2013.01)

(58) Field of Classification Search
CPC ......... H01L 22/32; H01L 24/16; H01L 22/12; H01L 23/488; G01N 3/24; G01N 2203/0017; G01N 2203/0025; G01N 2203/0075; G01N 2203/0064; G01M 99/007; G01R 31/2881; G01R 31/2896; G01R 31/2887; G01R 31/2853; G01R 31/2867; G01R 31/2868; G01R 31/2889

USPC .......... 324/754.08, 754.03, 754.01, 537, 500
See application file for complete search history.

(56) References Cited

U.S. PATENT DOCUMENTS

| 6,462,533 | B1 | 10/2002 | Shimizu |
| 6,708,399 | B2 | 3/2004 | Farnworth et al. |
| 6,998,860 | B1* | 2/2006 | Wood ................. G01R 31/2875 324/750.05 |
| 7,199,037 | B2 | 4/2007 | Luo et al. |
| 7,622,309 | B2 | 11/2009 | Su et al. |
| 7,733,102 | B2* | 6/2010 | Cheng ................. G01R 1/06744 324/762.01 |

(Continued)

FOREIGN PATENT DOCUMENTS

| JP | 3431872 | 5/2003 |
| KR | 10-2021-0005442 | 1/2021 |

*Primary Examiner* — Giovanni Astacio-Oquendo
(74) *Attorney, Agent, or Firm* — Morgan, Lewis & Bockius LLP

(57) ABSTRACT

A method of testing a semiconductor device includes forming conductive bumps respectively on a plurality of bonding pads of the semiconductor device. The semiconductor device having the conductive bumps is supported on a substrate stage. A gripper having first and second holders spaced apart from each other is positioned over the conductive bump. The conductive bump is clamped between the first and second holders. The gripper clamping the conductive bump is reciprocated at a constant speed with a predetermined stroke in a horizontal direction parallel with an upper surface of the substrate stage. A reliability of the semiconductor device is determined by measuring a time point at which a crack occurs in an upper wiring connected to the bonding pad.

20 Claims, 11 Drawing Sheets

(56) References Cited

U.S. PATENT DOCUMENTS

| | | |
|---|---|---|
| 7,810,374 B2 | 10/2010 | Zhang et al. |
| 8,100,021 B2 | 1/2012 | Sykes |
| 2014/0049280 A1* | 2/2014 | Kim .................... H01L 25/0657 |
| | | 324/754.19 |
| 2019/0019711 A1* | 1/2019 | Tamura .............. G01R 1/07307 |
| 2022/0026488 A1* | 1/2022 | Kim ................... G01R 31/2893 |
| 2023/0124392 A1* | 4/2023 | Konishi ............. G01R 1/07342 |
| | | 324/750.16 |

\* cited by examiner

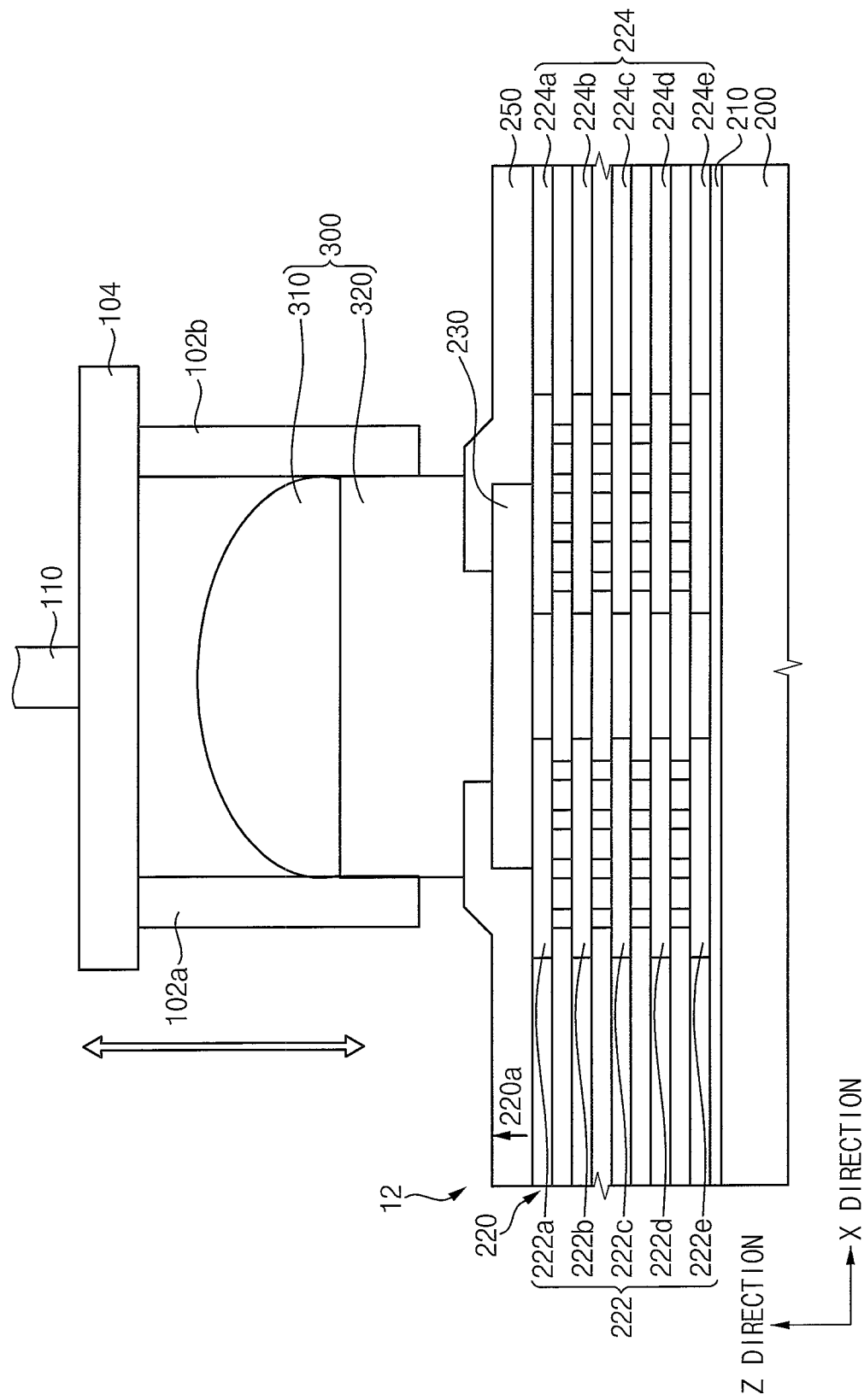

TEST APPARATUS AND METHOD FOR A SEMICONDUCTOR DEVICE

CROSS REFERENCE TO RELATED APPLICATION(S)

This application claims priority under 35 U.S.C. § 119 to Korean Patent Application No. 10-2021-0149424, filed on Nov. 3, 2021 in the Korean Intellectual Property Office, the disclosure of which is incorporated by reference in its entirety herein.

1. TECHNICAL FIELD

Embodiments of the present disclosure relate to a test apparatus and methods for a semiconductor device. More particularly, embodiments of the present disclosure relate to a test apparatus and methods for a semiconductor device including a plurality of conductive bumps.

2. DISCUSSION OF RELATED ART

In a semiconductor manufacturing process, a vertical direction test, such as a bump pull test, a horizontal direction test, such as a bump shear test, and various other tests may be used to confirm a quality of conductive bumps connecting semiconductor devices, such a chip package interaction. These tests may be applied by causing peelings of the conductive bump through the application of an instantaneous force in the chip mount process. However, these tests may not be applied in environmental reliability tests such as a temperature cycle test that causes peelings of the conductive bumps and back end of line (BEOL) wirings by a continuous force.

SUMMARY

Embodiments provide a test apparatus for a semiconductor device including a gripper that grips a conductive bump and reciprocates the conductive bump to determine a reliability of a semiconductor device.

Example embodiments provide a method of testing a semiconductor device using the test apparatus for a semiconductor device.

According to an embodiment of the present disclosure, a method of testing a semiconductor device includes forming conductive bumps respectively on a plurality of bonding pads of the semiconductor device. The semiconductor device having the conductive bumps is supported on a substrate stage. A gripper having first and second holders spaced apart from each other is positioned over the conductive bump. The conductive bump is clamped between the first and second holders. The gripper clamping the conductive bump is reciprocated at a constant speed with a predetermined stroke in a horizontal direction parallel with an upper surface of the substrate stage. A reliability of the semiconductor device is determined by measuring a time point at which a crack occurs in an upper wiring connected to the bonding pad.

According to an embodiment of the present disclosure, a method of testing a semiconductor device includes supporting a semiconductor device having conductive bumps on a substrate stage. The conductive bumps are bonded respectively on a plurality of bonding pads of the semiconductor device. A gripper having first and second holders spaced apart from each other is positioned over the conductive bump. The first and second holders are rotated to be aligned in a first direction parallel with an upper surface of the substrate stage. The gripper is lowered in a vertical direction perpendicular to the upper surface of the substrate stage so that the conductive bump is positioned between the first and second holders. The conductive bump is clamped between the first and second holders. A reliability of the semiconductor device is determined by reciprocating the gripper at a constant speed with a predetermined stroke in the first direction.

According to an embodiment of the present disclosure, a test apparatus for a semiconductor device includes a frame including a substrate stage. The substrate stage supports a semiconductor device having conductive bumps respectively disposed on a plurality of bonding pads. A gripper clamps any one of the conductive bumps to determine a durability of the semiconductor device. A horizontal driving unit reciprocates the gripper at a constant speed with a predetermined stroke in a horizontal direction. A vertical driving unit moves the gripper in a vertical direction. An analysis unit measures an external force applied to the gripper to determine a reliability of the semiconductor device. The gripper includes an upper base, first and second holders respectively extending downward from the upper base for clamping the conductive bump and a rotation driving unit rotating the upper base.

Thus, the gripper clamping the conductive bumps may reciprocate in the horizontal direction, and it may be possible to check stress (e.g., Chip Package Interaction Stress) generated between a chip and a semiconductor package during a semiconductor product reliability test process. Accordingly, it may be possible to perform an environmental reliability test on the semiconductor package in a wafer stage, and cost and time consumed in tests may be reduced compared to a conventional test that can only be performed in a package stage.

BRIEF DESCRIPTION OF THE DRAWINGS

Embodiments of the present disclosure will be more clearly understood from the following detailed description taken in conjunction with the accompanying drawings. FIGS. 1 to 11 represent non-limiting, example embodiments as described herein.

FIG. 1 is a cross-sectional view illustrating a test apparatus for a semiconductor device according to an embodiment of the present disclosure.

FIG. 2 is a perspective view illustrating a gripper in FIG. 1 according to an embodiment of the present disclosure.

FIG. 3 is a schematic view illustrating directions of a mechanical property test according to an embodiment of the present disclosure.

FIG. 4 is a cross-sectional view illustrating a semiconductor device to be tested by a test apparatus according to an embodiment of the present disclosure.

FIGS. 5 and 6 are cross-sectional views illustrating semiconductor devices having various conductive bumps according to embodiments of the present disclosure.

FIG. 7 is a flow chart illustrating a method of testing a semiconductor device according to an embodiment of the present disclosure.

FIGS. 8 to 11 are cross-sectional views illustrating a process of a mechanical property test according to embodiments of the present disclosure.

DETAILED DESCRIPTION OF EMBODIMENTS

Hereinafter, example embodiments will be explained in detail with reference to the accompanying drawings.

Figure 1:
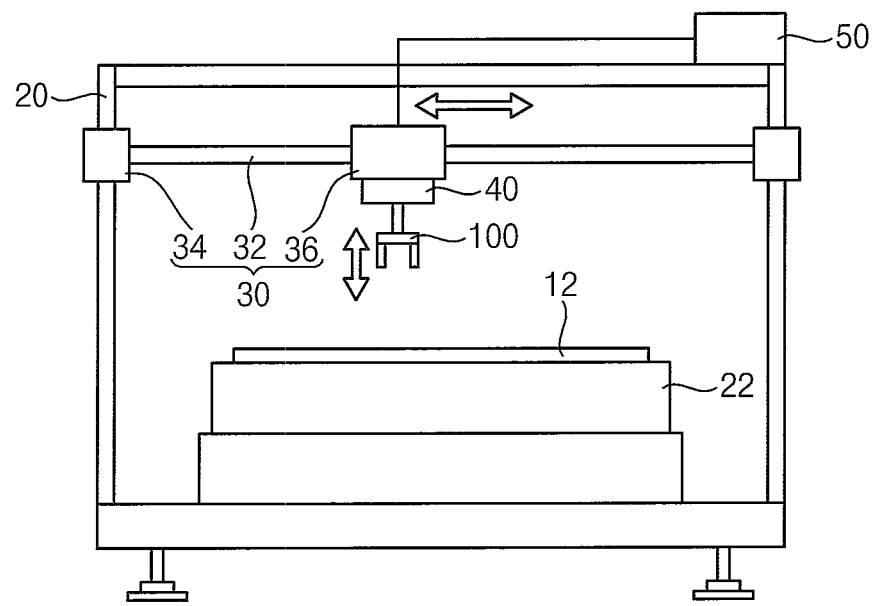
Figure 2:
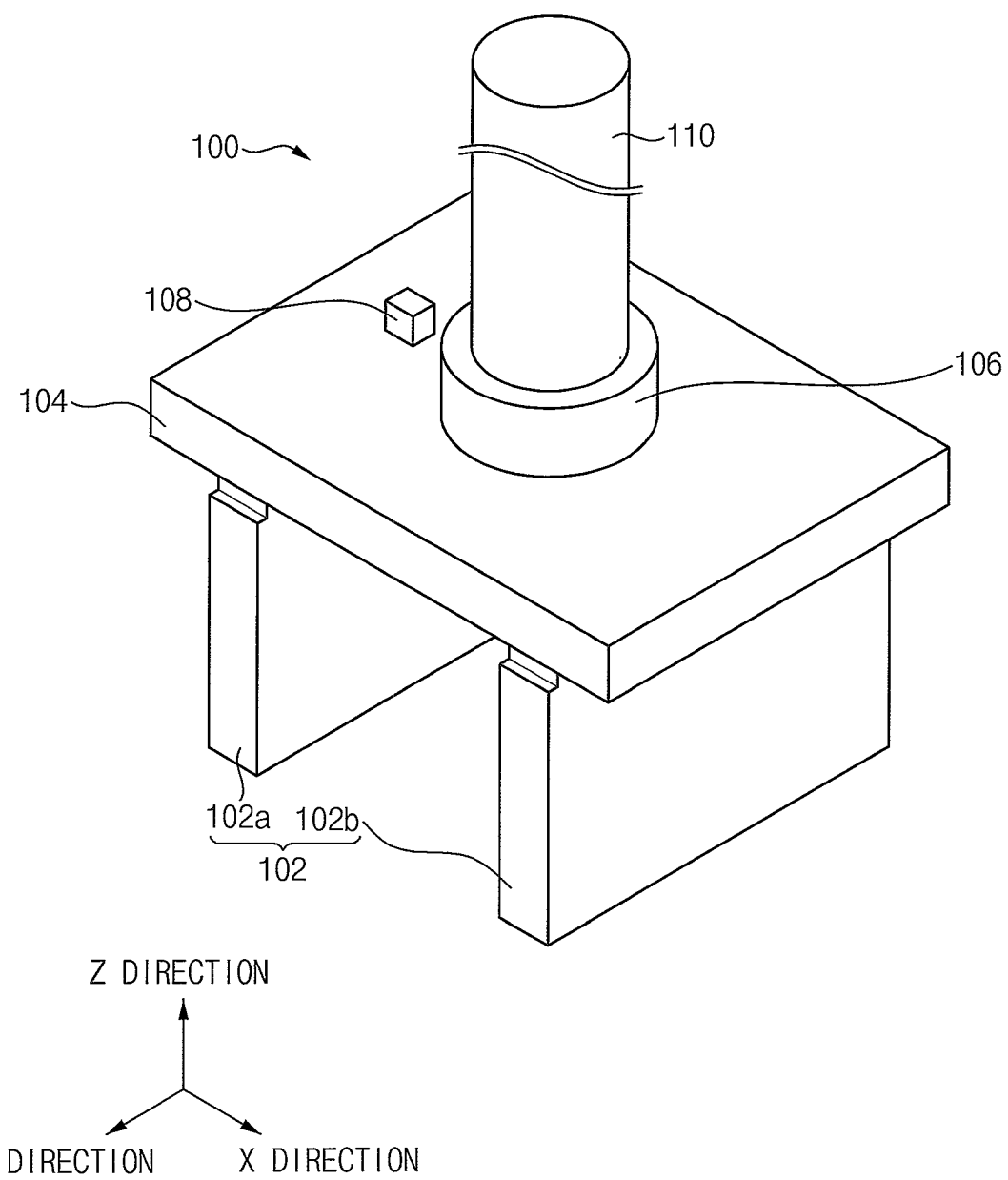
Figure 3:
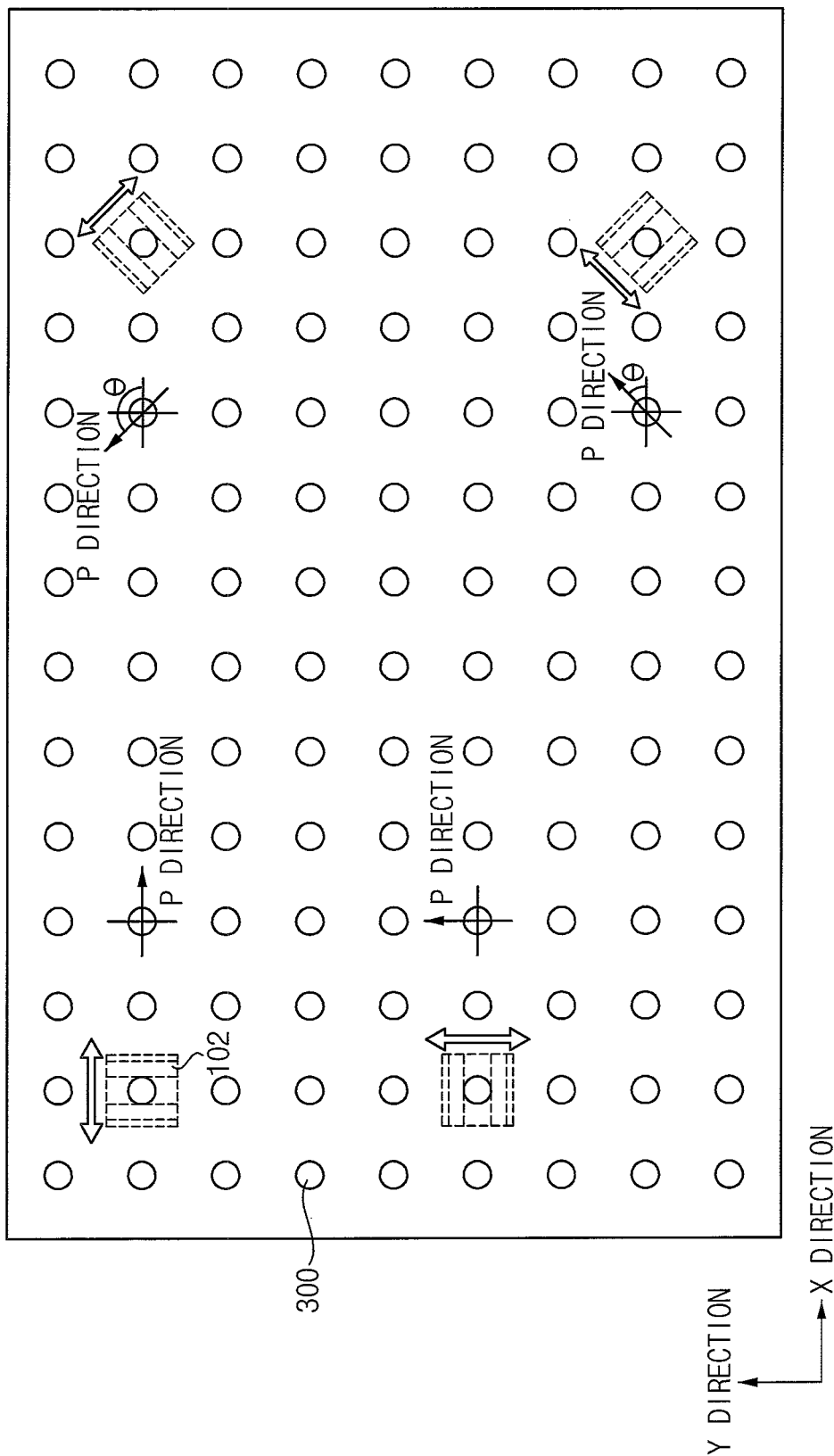

FIG. 1 is a cross-sectional view illustrating a test apparatus for a semiconductor device in accordance with an embodiment of the present disclosure. FIG. 2 is a perspective view illustrating a gripper in FIG. 1. FIG. 3 is a schematic view illustrating directions of a mechanical property test proceeds.

Referring to FIGS. 1 to 3, a test apparatus for a semiconductor device 10 may include a frame 20, a gripper 100 for testing mechanical properties of a semiconductor device 12, a horizontal driving unit 30 configured to move the gripper 100 in a first horizontal direction (hereinafter, an "X direction") parallel with the ground and a second horizontal direction (hereinafter, a "Y direction") parallel with the ground and perpendicular to the first horizontal direction, a vertical driving unit 40 configured to move the gripper 100 in a vertical direction (hereinafter, a "Z direction") perpendicular to the X and Y directions, and an analysis unit 50 configured to extract experimental data on the mechanical properties of the semiconductor device 12 from the gripper 100. The X direction and the Y direction may also be parallel to an upper surface of the substrate stage 22. The Z direction may be a thickness direction of the substrate stage 22 that is perpendicular to the upper surface of the substrate stage 22.

The test apparatus 10 may determine whether cracks have occurred in an upper wiring (BEOL, Back End Of Line) 222 provided in an upper wiring layer 220 and connected to bonding pads 230. The test apparatus 10 may inspect the mechanical properties related to a bonding force between a semiconductor chip and a package substrate by reproducing mechanical stress caused by a difference in a coefficient of thermal expansion (e.g., a CTE mismatch) between the semiconductor chip and the package substrate in a process of reliability testing such as temperature cycling (TC) test that changes hundreds to thousands of temperature cycles within a certain temperature range. The test apparatus 10 may inspect the mechanical properties of the semiconductor device 12 including the package substrate, an underfill member, a TIM Thermal Interface Material, heat slug, etc. For example, in an embodiment the semiconductor device 12 may be an electronic device having conductive bumps 300, such as a semiconductor wafer, a printed circuit board (PCB), etc.

The test apparatus 10 may inspect the mechanical properties of the conductive bump 300 provided on the bonding pad 230 of the semiconductor device 12 by using the gripper 100. The test apparatus 10 may check a quality of the conductive bump 300 for providing an interconnection (e.g., Chip Package Interaction) between semiconductor components. For example, in an embodiment the test apparatus 10 may measure shear stress and tensile stress related to the conductive bump 300.

In an embodiment, the frame 20 may constitute an external skeleton of the test apparatus 10. The frame 20 may protect the semiconductor device 12 from external impacts during a test process of the semiconductor device 12. In an embodiment, the frame 20 may support the horizontal driving unit 30 and the vertical driving unit 40 so that the gripper 100 is stably moved by the horizontal driving unit 30 and the vertical driving unit 40.

The frame 20 may include a substrate stage 22 configured to support the semiconductor device 12. For example, in an embodiment the substrate stage 22 may serve as a susceptor for supporting the semiconductor device 12. In an embodiment, the substrate stage 22 may include an electrostatic chuck for holding the semiconductor device 12 by an electrostatic force. The electrostatic chuck may adsorb and hold the semiconductor device 12 with the electrostatic force by a DC voltage supplied from a DC power source.

In an embodiment, the horizontal driving unit 30 may include a guide rail 32 fixed to the frame 20 and provided to be movable in the Y direction by a first moving body 34, and a second moving body 36 provided on the guide rail 32 to be movable in the X direction. The horizontal driving unit 30 may move the gripper 100 in the X and Y directions. Accordingly, the gripper 100 may be moved horizontally to be positioned over the conductive bump 300 by the horizontal driving unit 30.

The horizontal driving unit 30 may inspect the mechanical properties of the conductive bump 300 by horizontally reciprocating in the X and Y directions when the gripper 100 clamps the conductive bump 300. The horizontal driving unit 30 may measure a horizontal external force applied to the gripper 100 while exchanging signals with the analysis unit 50 as will be described later. The horizontal external force may be the same as the shear stress applied to the conductive bump 300. For example, in an embodiment the number of repetitions of the horizontal reciprocating motion by the horizontal driving unit 30 may be within a range of about 1,000 cycles to about 3,000 cycles. In an embodiment, a stroke (e.g., a reciprocating distance) L1 of the horizontal reciprocating motion by the horizontal driving unit 30 may be within a range of about 1 mm to about 2 mm.

In an embodiment, the vertical driving unit 40 may extend from the horizontal driving unit 30 in the vertical direction (e.g., the Z direction). The vertical driving unit 40 may adjust a length of a vertical extension unit 110 of the gripper 100 to move the gripper 100 in the Z direction. The vertical driving unit 40 may lower the gripper 100 in the Z direction such that the conductive bump 300 is pinched and fixed by holders 102, such as the first and second holders 102a, 102b to be clamped by the gripper 100. While an embodiment of FIG. 2 shows the holders 102 including two holders, embodiments of the present disclosure are not necessarily limited thereto and the holders 102 may include various numbers of holders.

The vertical driving unit 40 may inspect the mechanical properties of the conductive bump 300 by vertically reciprocating in the Z direction when the gripper 100 clamps the conductive bump 300. The vertical driving unit 40 may inspect a vertical external force applied to the gripper 100 while exchanging signals with the analysis unit 50 as will be described later. The vertical external force may be the same as the tensile stress applied to the conductive bump 300. For example, in an embodiment the number of repetitions of the vertical reciprocating motion by the vertical driving unit 40 may be within a range of about 1,000 cycles to about 3,000 cycles. A stroke (e.g., a reciprocating distance) L2 of the vertical reciprocating motion by the vertical driving unit 40 may be within a range of about 1 mm to about 2 mm.

In an embodiment, the analysis unit 50 may measure a time point at which a crack occurs in the upper wiring 222 connected to the bonding pad 230 and provided in the upper wiring layer 220. The time of occurrence of the crack may be measured by using a change in the external force applied by the first and second holders 102a, 102b.

The analysis unit 50 may exchange data with the horizontal driving unit 30 and the vertical driving unit 40. The analysis unit 50 may measure the horizontal external force generated in the horizontal driving unit 30. The horizontal external force may be the same as the shear stress applied to the conductive bump 300. The analysis unit 50 may measure the vertical external force generated in the vertical driving unit 40. The vertical external force may be the same as the tensile stress applied to the conductive bump 300.

In an embodiment, the analysis unit 50 may receive data from a micro-vibrating unit 108 as will be described later. In an embodiment, the micro-vibrating unit 108 may be embedded in the gripper 100 to generate micro-vibrations, and may measure minute vertical and horizontal external forces by applying the micro-vibrations to the conductive bump 300.

The analysis unit 50 may measure ductile-brittle strain. The analysis unit 50 may measure elongation rates of stress-strain plots for the horizontal and vertical reciprocating motions from a plurality of semiconductor devices 12. For example, the analysis unit 50 may measure an axial force and a displacement of the conductive bump 300 by using a change of a force applied by the gripper 100 while changing the speed of the horizontal or vertical reciprocating motion within a range of about 0.1 mm/s to about 400 mm/s.

The analysis unit 50 may measure a fracture characteristic between the conductive bump 300 and the bonding pad 230. The analysis unit 50 may measure the fracture characteristic of the upper wiring 222 inside the semiconductor device 12. The analysis unit 50 may accurately measure a breaking point of the upper wiring 222. The fracture characteristic may include at least one of the yield stress and the elongation rate of the semiconductor device 12.

The analysis unit 50 may measure the fracture characteristics based on at least one of an axial force-strain plot and a stress-strain plot measured during the vertical or horizontal reciprocating motion. The analysis unit 50 may determine through the elongation that ductile fracture or brittle fracture has occurred in the conductive bump 300 and the upper wiring 222 of the semiconductor device 12.

As illustrated in FIG. 2, in an embodiment the gripper 100 may include an upper base 104, the first and second holders 102a, 102b extending from the upper base 104 respectively to clamp the conductive bump 300, the vertical extension unit 110 connecting the upper base 104 and the vertical driving unit 40 to transmit a force to the gripper 100, and a rotation driving unit 106 configured to rotate the first and second holders 102a, 102b. The gripper 100 may further include the micro-vibrating unit 108 for generating micro-vibrations.

The gripper 100 may rotate the first and second holders 102a, 102b in a circumferential direction by using the rotation driving unit 106 such that the first and second holders 102a, 102b align in a test progress direction of the conductive bump 300.

The gripper 100 may clamp the conductive bump 300 between the first and second holders 102a, 102b. For example, in an embodiment a gap between the first and second holders 102a, 102b may have a first width D1, and the first width D1 may be within a range of about 40 μm to about 600 μm. The first and second holders 102a, 102b may change the first width D1 to clamp the conductive bump 300.

The gripper 100 may perform the horizontal reciprocating motion at a constant speed with a predetermined stroke in the horizontal directions (e.g., the X and Y directions) by using the horizontal driving unit 30 when the conductive bump 300 is held between the first and second holders 102a, 102b. For example, the predetermined stroke may be within a range of about 1 mm to about 2 mm. The constant speed may be within a range of about 0.1 mm/s to about 400 mm/s.

The gripper 100 may apply the horizontal external force to the conductive bump 300 by the first and second holders 102a, 102b performing the horizontal reciprocating motion. The horizontal driving unit 30 may measure the horizontal external force applied to the first and second holders 102a, 102b and transmit the horizontal external force to the analysis unit 50. The horizontal external force may be the same as the shear stress applied to the conductive bump 300. For example, in an embodiment the number of repetitions of the horizontal reciprocating motion of the gripper 100 may be within a range of about 1,000 cycles to about 3,000 cycles. The stroke L1 of the horizontal reciprocating motion of the gripper 100 may be within a range of about 1 mm to about 2 mm.

The gripper 100 may perform the vertical reciprocating motion in the vertical direction (e.g., the Z direction) by using the vertical driving unit 40 when the conductive bump 300 is held between the first and second holders 102a, 102b. The gripper 100 may apply a friction force to the first and second holders 102a, 102b by the conductive bump 300 in the vertical reciprocating motion. The vertical driving unit 40 may measure the friction force applied to the first and second holders 102a, 102b and transmit the friction force to the analysis unit 50. The vertical external force may be the same as the tensile stress applied to the conductive bump 300. For example, in an embodiment the number of repetitions of the vertical reciprocating motion of the gripper 100 may be within a range of about 1,000 cycles to about 3,000 cycles. The stroke L2 of the vertical reciprocating motion of the gripper 100 may be within a range of about 1 mm to about 2 mm.

In an embodiment, the first and second holders 102a, 102b may include an elastomer to prevent damage to the conductive bumps 300. The first and second holders 102a, 102b may stably clamp the conductive bump 300 without damaging the conductive bump 300. For example, in an embodiment the elastomer may include SBR rubber, BR synthetic rubber, HBR rubber, nitrile rubber, fluoro rubber, CR rubber, EPM rubber, silicone rubber, and the like. However, embodiments of the present disclosure are not necessarily limited thereto.

As illustrated in FIG. 3, the gripper 100 may clamp the conductive bump 300 after rotating the first and second holders 102a, 102b in the test progress direction. The test progress direction may be defined as a third horizontal direction (hereinafter, the "P direction"). The P direction may have a predetermined angle θ with respect to the X direction. Accordingly, the first and second holders 102a, 102b may be arranged to be spaced apart from each other in the P direction, and may clamp the conductive bump 300 in the P direction.

The gripper 100 may clamp the conductive bump 300 between the first and second holders 102a, 102b arranged in the X direction. In this embodiment, the gripper 100 may perform the horizontal reciprocating motion in the X direction to measure an adhesive force between the conductive bump 300 and the semiconductor device 12 in the X direction. The gripper 100 may perform the horizontal reciprocating motion in the X direction to determine a durability of the semiconductor device 12.

In an embodiment, the grippers 100 may then rotate the first and second holders 102a, 102b such that the first and second holders 102a, 102b are arranged to be spaced apart from each other in the P direction that forms the predetermined angle θ with respect to the X direction. The gripper 100 may clamp the conductive bump 300 between the first and second holders 102a, 102b arranged in the P direction. In this embodiment, the gripper 100 may then perform the horizontal reciprocating motion in the P direction to measure the adhesive force between the conductive bump 300 and the semiconductor device 12 in the P direction. The gripper 100 may perform the horizontal reciprocating motion in the P direction to determine the durability of the semiconductor device 12. For example, in an embodiment the predetermined angle θ may be within a range of about 0 degrees to about 360 degrees. Accordingly, the gripper 100 may perform the test on the conductive bump 300 in all directions.

Figure 4:
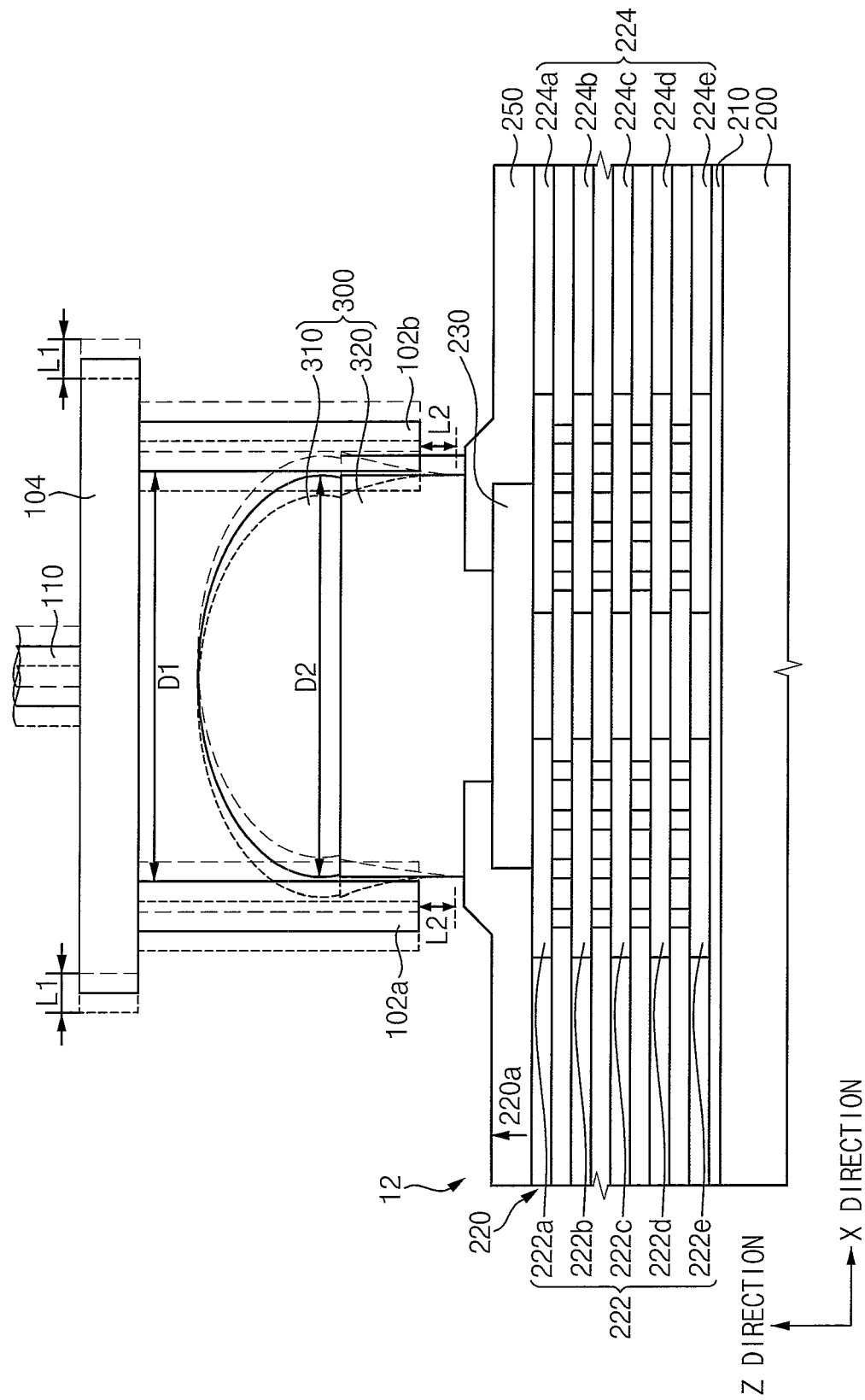

FIG. 4 is a cross-sectional view illustrating a semiconductor device to be tested by a test apparatus.

Referring to FIG. 4, a semiconductor device 12 may include a substrate 200, a circuit pattern layer 210, an upper wiring layer 220, a plurality of bonding pads 230, and a plurality of conductive bumps 300.

In an embodiment, the circuit pattern layer 210 may be provided on an upper surface of the substrate 200. Circuit patterns may be provided in the circuit pattern layer 210. For example, in an embodiment the circuit patterns may include transistors, diodes, capacitors, and the like. However, embodiments of the present disclosure are not necessarily limited thereto. The circuit patterns may constitute circuit elements. Thus, the semiconductor device 12 may be a semiconductor chip having a plurality of the circuit elements formed therein. An interlayer insulating layer covering the circuit patterns may be provided on the upper surface of the substrate 200. For example, an etch stop layer may be provided on the interlayer insulating layer. In an embodiment, the circuit patterns may be provided on the substrate 200 by performing a wafer process referred to as a front end of line (FEOL).

The circuit element may include a plurality of memory elements. Examples of the memory elements include a volatile semiconductor memory element and a non-volatile semiconductor memory element. Examples of the volatile semiconductor memory element include DRAM and SRAM. Examples of the non-volatile semiconductor memory element include EPROM, EEPROM, and Flash EEPROM. However, embodiments of the present disclosure are not necessarily limited thereto.

In an embodiment, the semiconductor device 12 may include the upper wiring layer 220 provided on the circuit pattern layer 210. The upper wiring layer 220 may be provided by performing a wiring process referred to as a back end of line (BEOL).

In an embodiment, the upper wiring layer 220 may include a plurality of insulating layers 224 and upper wirings 222 provided in the insulating layers. In an embodiment, the upper wirings 222 may include first to fifth upper wirings 222a, 222b, 222c, 222d and 222e However, embodiments of the present disclosure are not necessarily limited thereto and the number of the upper wirings 222 may vary. For example, in an embodiment the upper wirings 222 may include aluminum (Al), copper (Cu), tin (Sn), nickel (Ni), gold (Au), platinum (Pt), or an alloy thereof. The upper wirings 222 may be formed by a plating process, an electroless plating process, a vapor deposition process, etc.

The insulating layers 224 may include first to fifth insulating layers 224a, 224b, 224c, 224d and 224e. For example, the insulating layer 224 may include a polymer, a dielectric layer, etc. The insulating layer 224 may be formed by a vapor deposition process, a spin coating process, etc.

In an embodiment, the bonding pad 230 may be electrically connected to the upper wirings 222. The bonding pad 230 may be exposed from an upper surface of the upper wiring layer 220, such as a first surface 220a. For example, the first insulating layer 224a provided in the upper wiring layer 220 may have a first opening through which an upper surface of the first upper wiring 222a is exposed. The first upper wiring 222a may be connected to the bonding pad 230 through the first opening. For example, in an embodiment, the bonding pad 230 may include copper (Cu), aluminum (Al), titanium (Ti), nickel (Ni), molybdenum (Mo), titanium (Ti), gold (An), silver (Ag), chromium (Cr), tin (Sn), or an alloy thereof.

The semiconductor device 12 may further include a passivation layer 250 exposing a portion of the bonding pad 230. The passivation layer 250 may have a second opening that exposes an upper surface of the bonding pad 230. For example, in an embodiment the passivation layer 250 may include a polyimide material.

In an embodiment, the conductive bump 300 may include a copper pillar bump 320 and a solder bump 310 disposed on the copper pillar bump 320 (e.g., disposed directly thereon in the Z direction). The copper pillar bump 320 may be disposed on the upper surface of the bonding pad 230. For example, in an embodiment a second width D2 of the conductive bump 300 may be within a range of about 50 μm to about 500 μm.

The semiconductor device 12 may be mounted on a module substrate through the conductive bumps 300 to constitute a memory module. For example, in an embodiment the copper pillar bump 320 may include copper (Cu), tungsten (W), chromium (Cr), or an alloy thereof. The solder bump 310 may include tin (Sn), lead (Pb), or an alloy thereof. However, embodiments of the present disclosure are not necessarily limited thereto.

Although only some substrates, some bonding pads and some wirings are illustrated in the drawings, it may be understood that the number and arrangement of the substrates, the bonding pads and the wirings are exemplary, and embodiments of the present disclosure are not necessarily limited thereto. Since the wirings as well as the substrates are well known in the art to which the present disclosure pertains, illustration and description concerning the above elements will be omitted.

Figure 5:
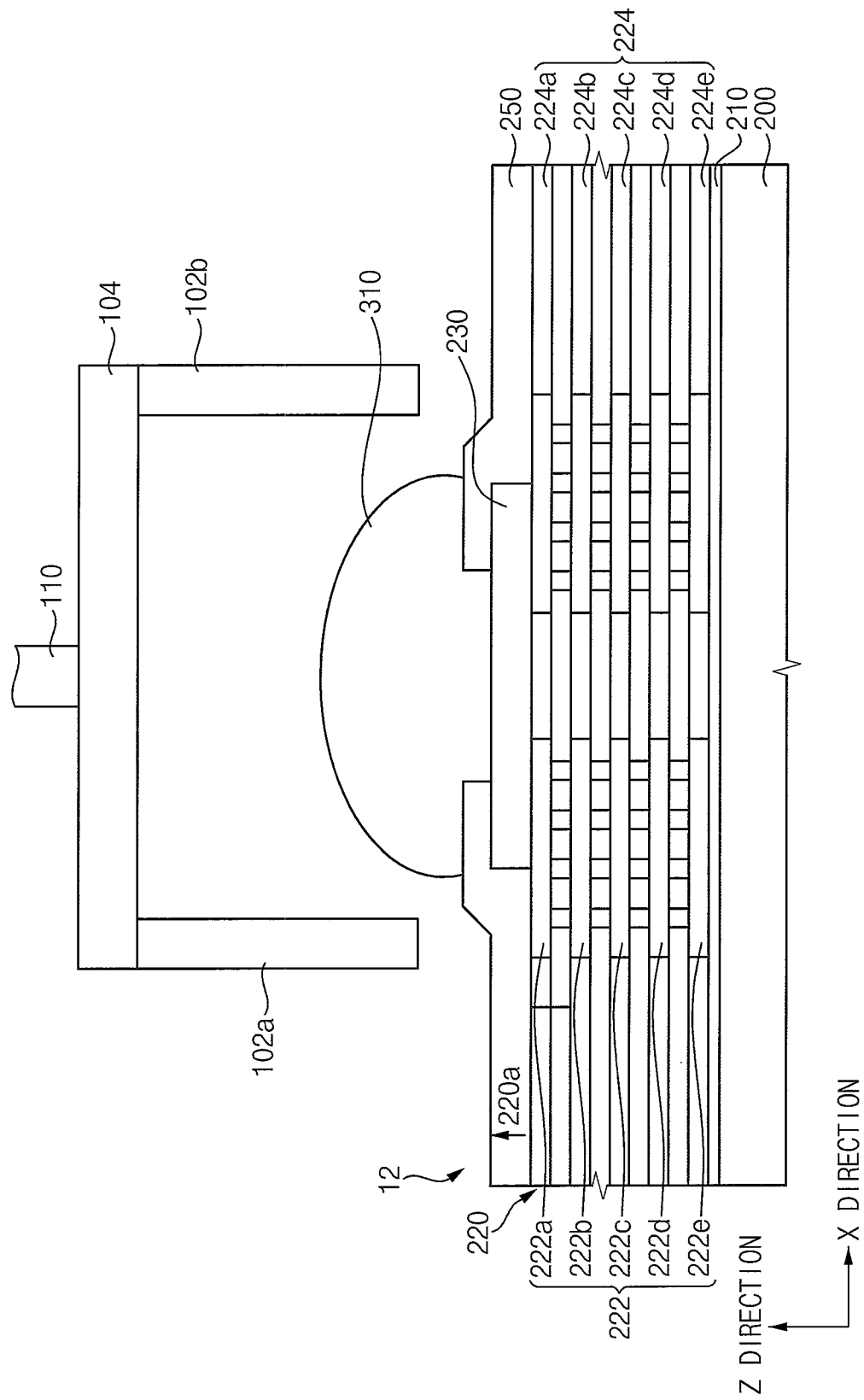
Figure 6:
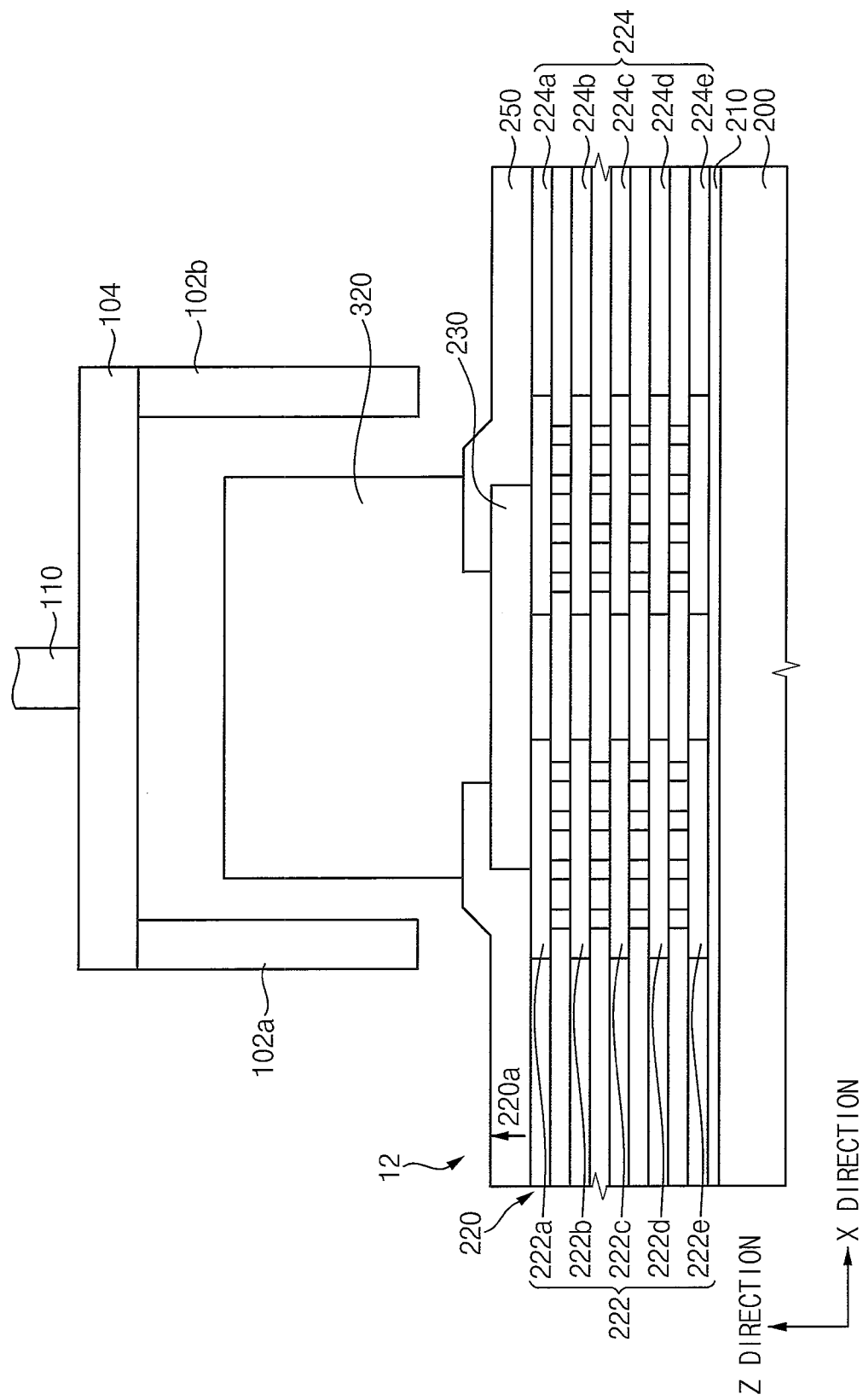

FIGS. 5 and 6 are cross-sectional views illustrating semiconductor devices having various conductive bumps in accordance with embodiments. The semiconductor device may be substantially the same as or similar to the semiconductor device described with reference to FIG. 4 except for a configuration of a conductive bump. Thus, same or similar components are denoted by the same or similar reference numerals, and repeated descriptions of the same components will be omitted.

Referring to FIG. 5, in an embodiment, a conductive bump 300 may be a solder bump 310. The solder bump 310 may be directly attached to a bonding pad 230. The conductive bump 300 may not include a copper pillar bump 320 as shown in an embodiment of FIG. 4.

A test apparatus for a semiconductor device 10 may clamp the solder bump 310 by using a gripper 100. The test apparatus 10 may measure an adhesive force between the solder bump 310 and the bonding pad 230 in a horizontal direction, and may determine a durability of the semiconductor device 12.

Referring to FIG. 6, in an embodiment, a conductive bump 300 may be a copper pillar bump 320. The copper pillar bump 320 may be directly attached to a bonding pad 230. The conductive bump 300 may not include a solder bump 310 as shown in embodiments of FIGS. 4-5.

The test apparatus 10 may clamp the copper pillar bump 320 by using the gripper 100. The test apparatus 10 may measure an adhesive force between the copper pillar bump 320 and the bonding pad 230 in a horizontal direction, and may determine the durability of the semiconductor device 12.

As described above, the gripper 100 gripping the conductive bump 300 may move in the X direction, the Y direction and the Z direction, and may measure a stress (e.g., a Chip Package Interaction Stress) generated between the semiconductor chip and the package substrate during a semiconductor product reliability test process. Accordingly, it is possible to perform an environmental reliability test on the semiconductor package in a wafer stage, and cost and time consumed in tests may be reduced compared to a conventional test that can be performed only in a package stage.

Hereinafter, a method of testing a semiconductor device by using the test apparatus in FIG. 1 will be explained.

Figure 7:
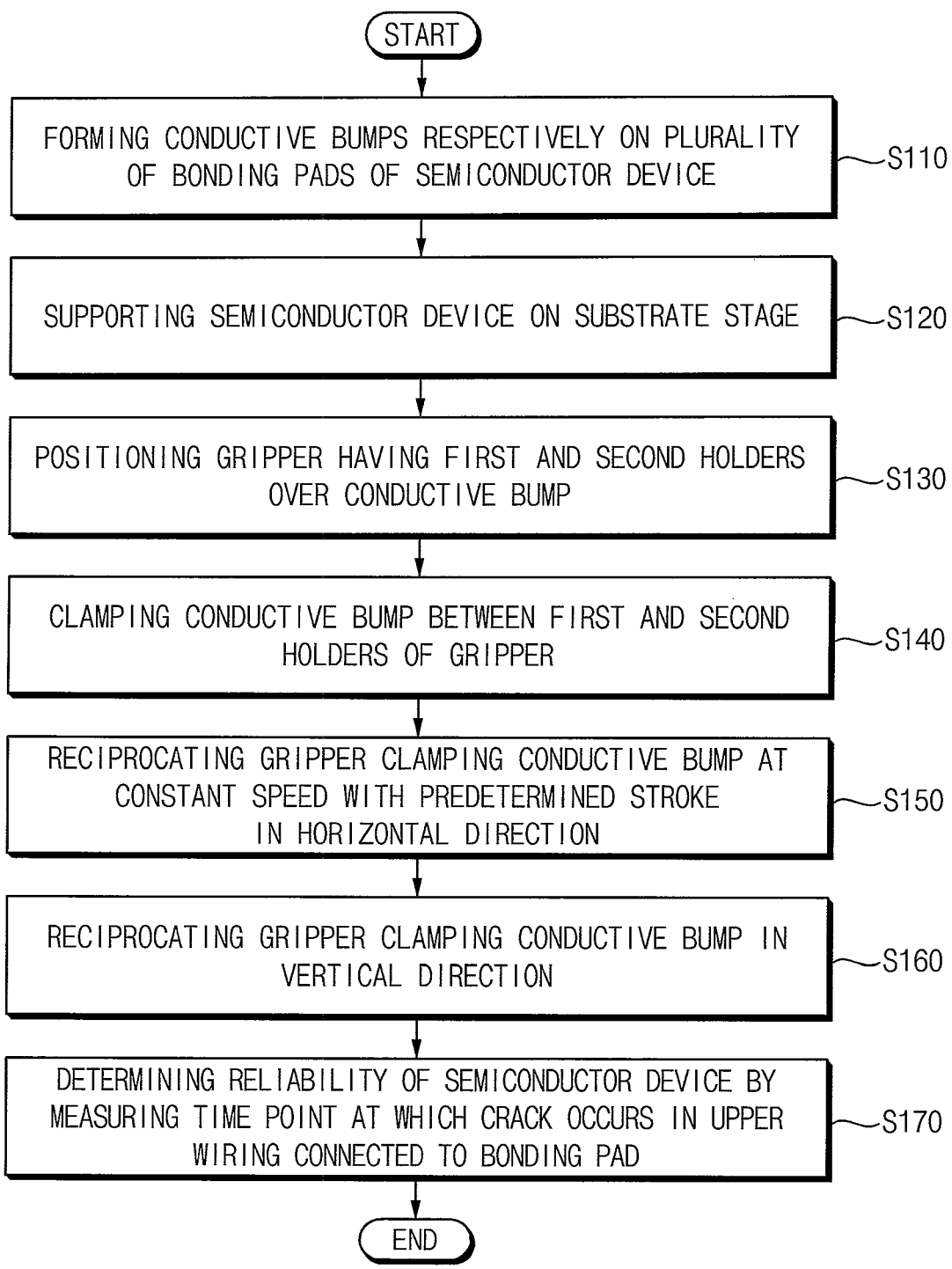

FIG. 7 is a flow chart illustrating a method of testing a semiconductor device in accordance with example embodiments. FIGS. 8 to 11 are cross-sectional views illustrating a process of a mechanical property test.

Referring to FIGS. 1 to 11, first, conductive bumps 300 may be formed on a plurality of bonding pads 230 of a semiconductor device 12, respectively in block S110. For example, one conductive bump 300 of the conductive bumps may be formed on one bonding pad 230 of the plurality of bonding pads of the semiconductor device In an embodiment, the semiconductor device 12 may include any electronic device having the conductive bumps 300, such as a semiconductor wafer and a printed circuit board (PCB).

The semiconductor device 12 provided with the conductive bumps 300 may then be supported on a substrate stage 22 in block S120.

In an embodiment, the semiconductor device 12 may be loaded on the substrate stage 22. For example, in an embodiment the substrate stage 22 may adsorb and hold the semiconductor device 12 with an electrostatic force by using an electrostatic chuck. The electrostatic chuck may adsorb and hold the semiconductor device 12 by an electrostatic attraction thereon.

A gripper 100 having first and second holders 102a, 102b spaced apart from each other may then be positioned over the conductive bump 300 in block S130. For example, the first and second holders 102a, 102b may be positioned at least partially above the conductive bump 300 in the Z direction.

In an embodiment, the gripper 100 may be positioned over a target conductive bump 300 by a horizontal driving unit 30. For example, in an embodiment the target conductive bump 300 may be the conductive bump 300 positioned in a peripheral region, among a plurality of the conductive bumps 300 provided on the semiconductor wafer, a semiconductor substrate, and the like. The target conductive bump 300 may be the conductive bump 300 positioned in a portion of the semiconductor device 12 having relatively low reliability in adhesive strength, durability, and the like. Thus, the reliability of the semiconductor device 12 may be evaluated by performing a test on some of a plurality of the conductive bumps 300.

The conductive bump 300 may then be clamped between the first and second holders 102a, 102b in block S140.

In an embodiment, the first and second holders 102a, 102b may rotate by a predetermined angle θ in a test progress direction. The first and second holders 102a, 102b may be rotated in the test progress direction by a rotation driving unit 106.

Figure 8:
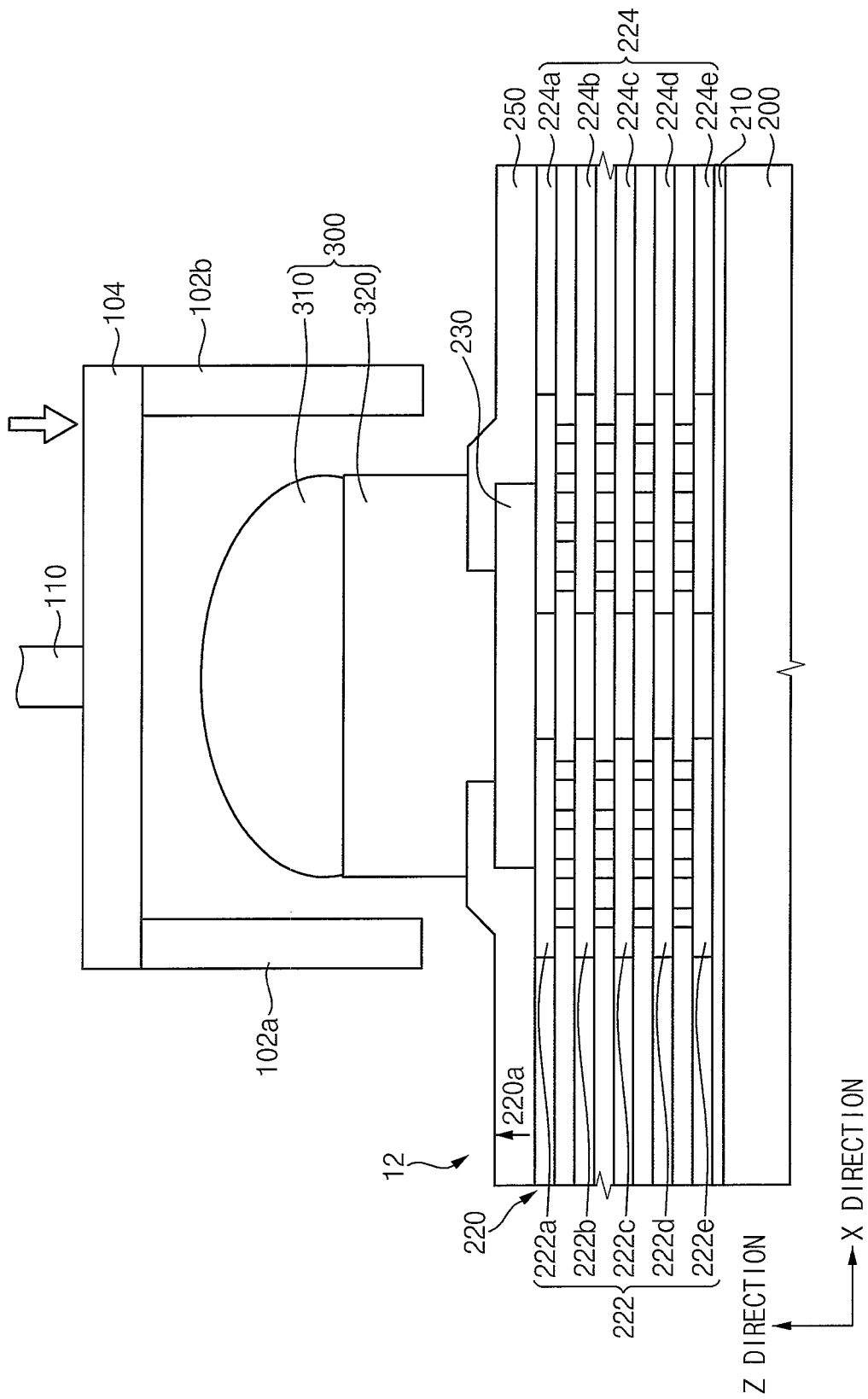

The gripper 100 may be moved in the Z direction by a vertical driving unit 40 extending in the Z direction from the horizontal driving unit 30. As illustrated in FIG. 8, the gripper 100 may be lowered such that the conductive bump 300 is positioned between the first and second holders 102a, 102b.

Figure 9:
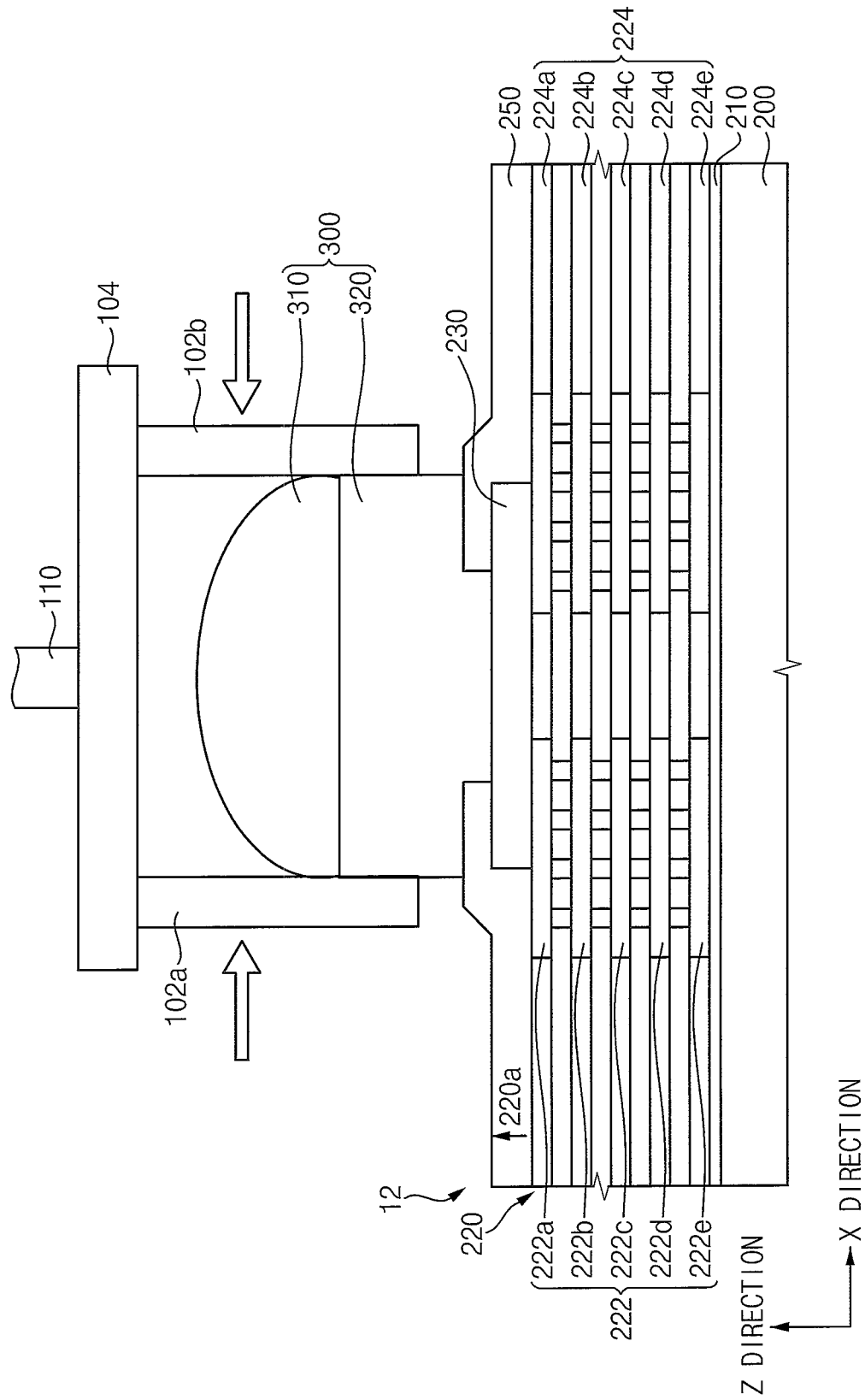

In an embodiment, the first and second holders 102a, 102b may move to be in proximity with each other to clamp the conductive bump 300. As illustrated in FIG. 9, the first and second holders 102a, 102b may be placed in direct contact with the conductive bump 300 positioned therebetween. The first and second holders 102a, 102b may clamp the conductive bump 300 in the test progress direction for performing the test on the conductive bump 300. For example, since the first and second holders 102a, 102b include an elastomer, the conductive bump 300 may be held without being damaged by the first and second holders 102a, 102b.

In an embodiment, the gripper 100 clamping the conductive bump 300 may reciprocate at a constant speed with a predetermined stroke in a horizontal direction parallel with an upper surface of the substrate stage 22 in block S150.

In an embodiment, the gripper 100 may reciprocate repeatedly at the constant speed with the predetermined stroke in the horizontal direction by the horizontal driving unit 30. The horizontal driving unit 30 may measure a horizontal external force applied to the gripper 100 while exchanging signals with an analysis unit 50. For example, in an embodiment, the predetermined stroke may be within a range of about 1 mm to about 2 mm. The constant speed may be within a range of about 0.1 mm/s to about 400 mm/s.

Figure 10:
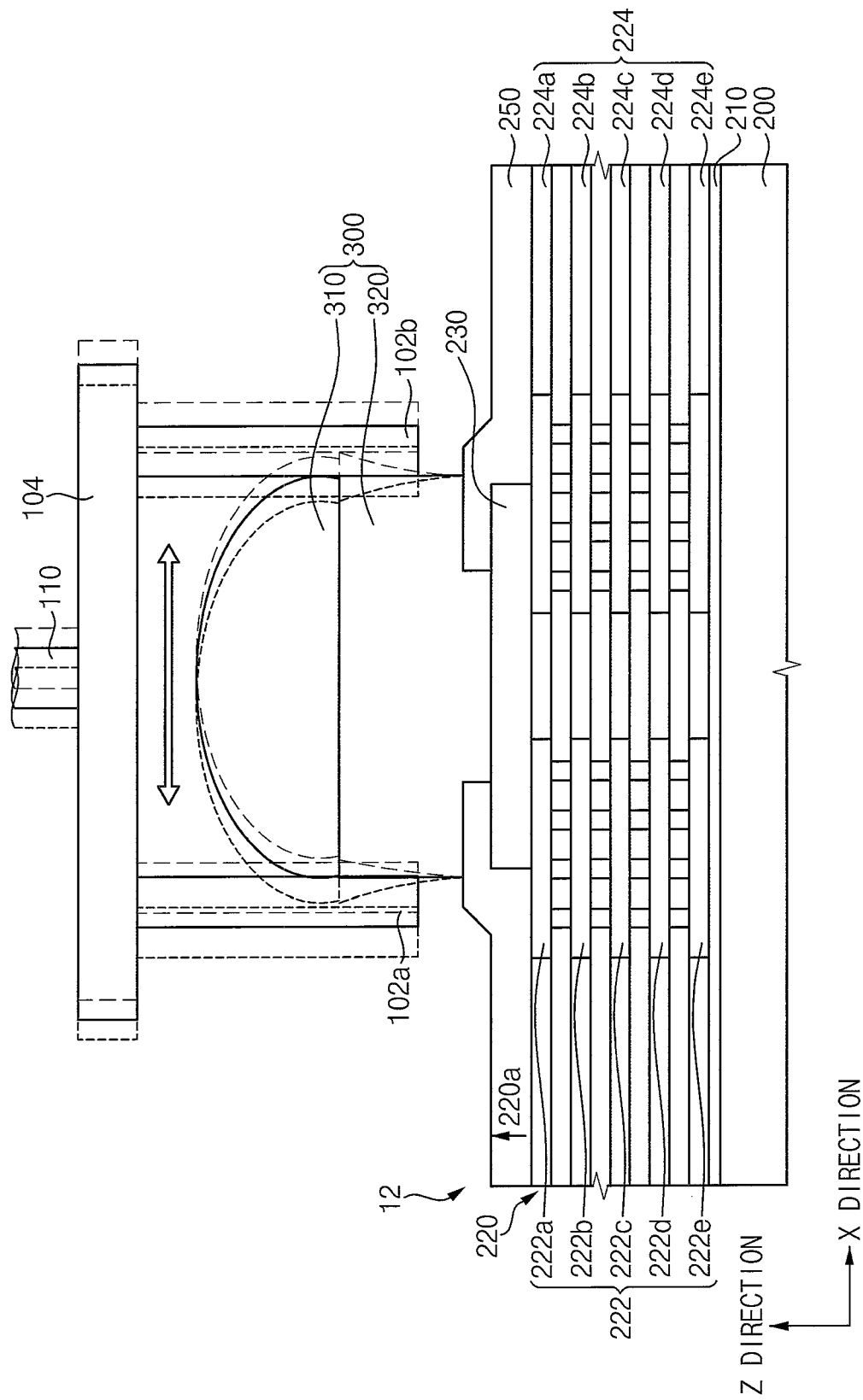

As illustrated in FIG. 10, the gripper 100 may reciprocate in the X direction. The gripper 100 may also rotate in the P direction forming the predetermined angle θ with the X direction, and may reciprocate in the P direction. Thus, the gripper 100 may perform the test the conductive bump 300 at various angles.

In an embodiment, the gripper 100 clamping the conductive bump 300 may be vibrated in the X direction or the P direction by a micro-vibrating unit 108. Thus, the gripper 100 may reciprocate with finer micro-vibration in a range that cannot be measured by the horizontal driving unit 30, and the analysis unit 50 may measure a result of the micro-vibration.

The gripper 100 clamping the conductive bump 300 may reciprocate in the Z direction in block S160.

As illustrated in FIG. 11, the first and second holders 102a, 102b holding the conductive bump 300 may reciprocate in the Z direction. The vertical driving unit 40 may measure a vertical external force applied to the gripper 100 by exchanging signals with the analysis unit 50. For example, a reciprocating motion of the first and second holders 102a, 102b may be repeated until the conductive bump 300 is separated from the bonding pad 230.

The reliability of the semiconductor device 12 may be determined by measuring a time point at which a crack occurs in an upper wiring 222 connected to the bonding pad 230 in block S170 due to the force of the reciprocation of the gripper 100 on the conductive bump 300 in a horizontal direction (e.g., the X direction or the P direction) and/or the Z direction.

In an embodiment, the time point at which the crack occurs in the upper wiring (BEOL, Back End Of Line) 222 connected to the bonding pad 230 and provided in the upper wiring layer 220 may be measured. The time point at which the crack occurs may be measured by detecting a change in an external force applied to the first and second holders 102a, 102b.

Embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure.

What is claimed is:

1. A method of testing a semiconductor device, the method comprising:
   forming conductive bumps respectively on a plurality of bonding pads of the semiconductor device;
   supporting the semiconductor device having the conductive bumps on a substrate stage;
   positioning a gripper having first and second holders spaced apart from each other over the conductive bump;
   clamping the conductive bump between the first and second holders;
   reciprocating the gripper clamping the conductive bump at a constant speed with a predetermined stroke in a horizontal direction parallel with an upper surface of the substrate stage; and
   determining, by an analysis unit of a test apparatus, a reliability of the semiconductor device by measuring a time point at which a crack occurs in an upper wiring connected to the bonding pad.

2. The method of claim 1, wherein the predetermined stroke is within a range of about 1 mm to about 2 mm.

3. The method of claim 1, wherein the constant speed is within a range of about 0.1 mm/s to about 400 mm/s.

4. The method of claim 1, further comprising:
   reciprocating the gripper clamping the conductive bump in a vertical direction perpendicular with the upper surface of the substrate stage.

5. The method of claim 1, wherein reciprocating the gripper clamping the conductive bump at the constant speed comprises:
   reciprocating in a first direction;
   rotating the gripper in a second direction that forms a predetermined angle with the first direction; and
   reciprocating the gripper in the second direction.

6. The method of claim 1, wherein measuring the time point at which the crack occurs in the upper wiring connected to the bonding pad comprises:
   measuring the time point by detecting a change in an external force applied to the first and second holders.

7. The method of claim 1, further comprising:
   measuring shear stress and tensile stress of the conductive bump.

8. The method of claim 1, wherein a distance between the first and second holders is within a range of about 40 μm to about 600 μm.

9. The method of claim 1, wherein the first and second holders include an elastomer preventing damage to the conductive bumps.

10. The method of claim 1, wherein the conductive bump includes a copper pillar bump and a solder bump disposed on the copper pillar bump.

11. A method of testing a semiconductor device, the method comprising:
   supporting a semiconductor device having conductive bumps on a substrate stage, the conductive bumps are bonded respectively on a plurality of bonding pads of the semiconductor device;
   positioning a gripper having first and second holders spaced apart from each other over the conductive bump;
   rotating the first and second holders to be aligned in a first direction parallel with an upper surface of the substrate stage;
   lowering the gripper in a vertical direction perpendicular to the upper surface of the substrate stage so that the conductive bump is positioned between the first and second holders;
   clamping the conductive bump between the first and second holders; and
   determining, by an analysis unit of a test apparatus, a reliability of the semiconductor device by reciprocating the gripper at a constant speed with a predetermined stroke in the first direction.

12. The method claim 11, wherein the predetermined stroke is within a range of about 1 mm to about 2 mm.

13. The method claim 11, wherein the constant speed is within a range of about 0.1 mm/s to about 400 mm/s.

14. The method claim 11, further comprising:
   reciprocating the gripper clamping the conductive bump in the vertical direction.

15. The method claim 11, further comprising:
   rotating the gripper in a second direction that forms a predetermined angle with the first direction; and
   reciprocating the gripper at the constant speed with a predetermined stroke in the second direction.

16. The method claim 11, wherein the semiconductor device includes an upper wiring connected to the bonding pad, and
   wherein determining the reliability of the semiconductor device includes measuring a time point at which a crack occurs in the upper wiring.

17. The method claim 16, wherein measuring the time point at which the crack occurs in the upper wiring comprises:
   measuring the time point by using a change in an external force applied to the first and second holders.

18. The method claim 11, wherein a distance between the first and second holders is within a range of about 40 μm to about 600 μm.

19. The method claim 11, wherein the conductive bump includes a copper pillar bump and a solder bump disposed on the copper pillar bump.

20. A test apparatus for a semiconductor device, comprising:
   a frame including a substrate stage, the substrate stage supports a semiconductor device having conductive bumps respectively disposed on a plurality of bonding pads;
   a gripper that clamps any one of the conductive bumps to determine a durability of the semiconductor device;
   a horizontal driving unit reciprocating the gripper at a constant speed with a predetermined stroke in a horizontal direction;
   a vertical driving unit moving the gripper in a vertical direction; and
   an analysis unit measuring an external force applied to the gripper to determine a reliability of the semiconductor device,
   wherein the gripper comprises:
   an upper base;

first and second holders respectively extending downward from the upper base for clamping the conductive bump; and a rotation driving unit rotating the upper base.

* * * * *